US010908983B2

(12) United States Patent
Giroux et al.

(10) Patent No.: US 10,908,983 B2
(45) Date of Patent: Feb. 2, 2021

(54) METHOD AND SYSTEM FOR PREVENTING AN ANOMALY IN A SIMULATOR

(71) Applicant: CAE INC., Saint-Laurent (CA)

(72) Inventors: Ann-Katherine Giroux, Saint-Laurent (CA); Michel Galibois, Saint-Laurent (CA); Yannick Heneault, Saint-Laurent (CA); Gunther Sascha Filkorn, Saint-Laurent (CA); Francis Meloche-Charlebois, Saint-Laurent (CA)

(73) Assignee: CAE INC., Saint-Laurent (CA)

( * ) Notice: Subject to any disclaimer, the term of this patent is extended or adjusted under 35 U.S.C. 154(b) by 127 days.

(21) Appl. No.: 15/476,049

(22) Filed: Mar. 31, 2017

(65) Prior Publication Data

US 2018/0285179 A1    Oct. 4, 2018

(51) Int. Cl.
| | |
|---|---|
| *G06F 11/00* | (2006.01) |
| *G06F 11/07* | (2006.01) |
| *G09B 9/00* | (2006.01) |
| *G06F 30/20* | (2020.01) |

(52) U.S. Cl.
CPC ........ *G06F 11/079* (2013.01); *G06F 11/0778* (2013.01); *G06F 30/20* (2020.01); *G09B 9/00* (2013.01)

(58) Field of Classification Search
CPC . H04L 43/06; H04L 43/0817; H04L 41/0631; H04L 41/0686; H04Q 9/02; G06F 11/0709
See application file for complete search history.

(56) References Cited

U.S. PATENT DOCUMENTS

| | | | | |
|---|---|---|---|---|
| 5,107,499 A | * | 4/1992 | Lirov | G06F 11/2257 706/911 |
| 5,127,005 A | * | 6/1992 | Oda | G06F 11/2257 714/26 |
| 5,483,637 A | * | 1/1996 | Winokur | H04L 43/00 714/26 |
| 5,758,062 A | | 5/1998 | McMahon et al. | |
| 6,126,548 A | | 10/2000 | Jacobs et al. | |
| 6,487,513 B1 | * | 11/2002 | Eastvold | A61B 6/4411 702/108 |

(Continued)

FOREIGN PATENT DOCUMENTS

CA         2920913 A      4/2016

*Primary Examiner* — Bryce P Bonzo
*Assistant Examiner* — Jeison C Arcos
(74) *Attorney, Agent, or Firm* — Fasken Martineau DuMoulin

(57) ABSTRACT

There is described an apparatus for preventing a problem in a simulator comprising a plurality of components, comprising: a communication unit for at least one of transmitting data and receiving data; a memory having stored thereon a database containing a plurality of lists of events each associated with a respective source of anomaly; a processing unit configured for: receiving an actual state of operation for at least some of the plurality of components; determining that a given one of the plurality of lists of event has partially occurred using the actual state of operation; and outputting an alert indicative of the respective source of anomaly associated with the given one of the plurality of lists of event via the communication unit.

18 Claims, 6 Drawing Sheets

(56) References Cited

U.S. PATENT DOCUMENTS

| | | | |
|---|---|---|---|
| 7,139,938 B2 * | 11/2006 | Marwaha | H04L 41/0686 714/48 |
| 7,203,881 B1 * | 4/2007 | Williams | G06F 11/0709 714/741 |
| 7,379,846 B1 * | 5/2008 | Williams | G06F 11/079 702/183 |
| 7,490,319 B2 | 2/2009 | Blackwell et al. | |
| 7,774,361 B1 * | 8/2010 | Nachenberg | G06F 17/30306 707/779 |
| 8,079,022 B2 | 12/2011 | Seneski et al. | |
| 8,433,542 B2 | 4/2013 | Kube et al. | |
| 8,612,192 B2 | 12/2013 | Larsson et al. | |
| 9,355,017 B2 | 5/2016 | Neumeyer et al. | |
| 9,372,781 B2 | 6/2016 | Brunkhorst et al. | |
| 2003/0200486 A1 * | 10/2003 | Marwaha | H04L 41/0686 714/39 |
| 2004/0033799 A1 * | 2/2004 | Fontius | H04Q 9/02 455/423 |
| 2004/0181685 A1 * | 9/2004 | Marwaha | H04L 41/0686 726/22 |
| 2004/0205374 A1 * | 10/2004 | Poletto | H04L 41/064 714/4.2 |
| 2004/0236820 A1 * | 11/2004 | Flocken | G06F 11/0709 709/200 |
| 2005/0080806 A1 * | 4/2005 | Doganata | G06F 11/0709 |
| 2006/0177808 A1 * | 8/2006 | Aosawa | G06F 17/2705 434/322 |
| 2007/0078970 A1 * | 4/2007 | Zabihi | H04L 1/22 709/224 |
| 2007/0202469 A1 * | 8/2007 | Davidson | G09B 25/00 434/29 |
| 2007/0220365 A1 * | 9/2007 | Castellani | G06Q 10/00 714/46 |
| 2007/0299717 A1 * | 12/2007 | Yamamoto | G06Q 10/04 705/7.27 |
| 2008/0117213 A1 * | 5/2008 | Cirit | G06T 11/20 345/440 |
| 2008/0120129 A1 * | 5/2008 | Seubert | G06Q 10/06 705/35 |
| 2008/0300845 A1 | 12/2008 | Kostick et al. | |
| 2009/0030753 A1 * | 1/2009 | Senturk-Doganaksoy | G05B 23/0221 705/7.38 |
| 2009/0157365 A1 | 6/2009 | Higuchi et al. | |
| 2010/0118741 A1 * | 5/2010 | Youn | H04W 72/1242 370/259 |
| 2010/0120392 A1 * | 5/2010 | Youn | H04W 4/90 455/404.1 |
| 2012/0166142 A1 * | 6/2012 | Maeda | G05B 23/0227 702/185 |
| 2013/0067070 A1 * | 3/2013 | Rowe | G06Q 30/0201 709/224 |
| 2014/0186810 A1 | 7/2014 | Falash et al. | |
| 2015/0113520 A1 | 4/2015 | Kotani et al. | |
| 2015/0269060 A1 * | 9/2015 | Rodmell | G06F 11/3664 717/124 |
| 2016/0163216 A1 * | 6/2016 | Galibois | G09B 9/02 434/49 |

* cited by examiner

METHOD AND SYSTEM FOR PREVENTING AN ANOMALY IN A SIMULATOR

TECHNICAL FIELD

The present invention relates to the field of methods and system for preventing anomalies in a simulator.

BACKGROUND

A simulator is a piece of equipment that is designed to represent real conditions. Simulators are usually used as a training device for training people. For example, flight simulators are used by commercial airlines and air forces to train their pilots to face various types of situations. Medical simulators such as patient simulators are usually used to train medical staff.

Some simulators correspond to complex systems, i.e., they are composed of many systems, subsystems and/or components which may interact with each other. When an anomaly occurs in such a simulator, it may be difficult to determine the source of the anomaly due to the complexity of the simulator. For example, it may take several hours or even several days for a technician to find the source of the detected anomaly.

Therefore, there is a need for a method and a system for preventing anomalies in a simulator.

SUMMARY

According to a first broad aspect, there is provided an apparatus for diagnosing a problem in a simulator comprising a plurality of components, comprising: a communication unit for at least one of transmitting data and receiving data; a memory having stored thereon a database containing a plurality of lists of events each associated with a respective anomaly of the simulator and a respective source of anomaly; a processing unit configured for: receiving a detected anomaly of the simulator via the communication unit; retrieving from the database at least a given one of the plurality of lists of events that correspond to the detected anomaly; receiving an actual state of operation for at least some of the plurality of components; identifying a source of the detected anomaly by comparing the received actual state of operation and at least a given one of the plurality of lists of events; and outputting the source of the detected anomaly via the communication unit.

In one embodiment, each one of the events comprises one of a given state of operation and a given variation of state of operation.

In one embodiment, the given state of operation is an abnormal state of operation.

In one embodiment, the processing unit is further configured for determining the actual state of operation.

In one embodiment, the processing unit is adapted to transmit via the communication unit a request indicative of a desired state of operation for at least a desired one of the plurality of components.

In one embodiment, the processing unit is further configured for detecting the detected anomaly.

In one embodiment, the processing unit is configured for detecting the detected anomaly by receiving the actual operation state for the plurality of components and comparing the actual state of operation to a normal state of operation stored in the database.

In one embodiment, at least one of the lists of events is predefined.

In one embodiment, the processing unit is configured for determining if the events contained in a given one of the plurality of lists of events occurred using the actual state of operation and identifying the source of the detected anomaly as being the respective source of anomaly that is associated with the given one of the plurality of lists of events.

In one embodiment, the database further contains a respective probability of occurrence associated with each one of the plurality of lists of events.

According to a second broad aspect, there is provided a computer-implemented method for diagnosing a problem in a simulator including a plurality of components, comprising: receiving a detected anomaly of the simulator; accessing a database containing a plurality of lists of events each associated with a respective anomaly of the simulator and a respective source of anomaly; retrieving from the database at least a given one of the plurality of lists of events that correspond to the detected anomaly; receiving an actual state of operation for at least some of the plurality of components; identifying a source of the detected anomaly by comparing the received actual state of operation and at least a given one of the plurality of lists of events; and outputting the source of the detected anomaly via the communication unit.

In one embodiment, each one of the events comprises one of a given state of operation and a given variation of state of operation.

In one embodiment, the given state of operation is an abnormal state of operation.

In one embodiment, the step of receiving the actual state of operation comprises determining the actual state of operation.

In one embodiment, the step of determining the actual state of operation comprises transmitting a request indicative of a desired state of operation for at least a desired one of the plurality of components.

In one embodiment, the step of receiving a detected anomaly comprises detecting the detected anomaly.

In one embodiment, the step of detecting the detected anomaly comprises receiving the actual operation state for the plurality of components and comparing the actual state of operation to a normal state of operation stored in the database.

In one embodiment, at least one of the lists of events is predefined.

In one embodiment, the step of identifying a source of the detected anomaly comprises determining if the events contained in a given one of the plurality of lists of events occurred using the actual state of operation and identifying the source of the detected anomaly as being the respective source of anomaly that is associated with the given one of the plurality of lists of events.

In one embodiment, the database further contains a respective probability of occurrence associated with each one of the plurality of lists of events.

According to another broad aspect, there is provided an apparatus for preventing a problem in a simulator comprising a plurality of components, comprising: a communication unit for at least one of transmitting data and receiving data; a memory having stored thereon a database containing a plurality of lists of events each associated with a respective source of anomaly; a processing unit configured for: receiving an actual state of operation for at least some of the plurality of components; determining that a given one of the plurality of lists of event has partially occurred using the actual state of operation; and outputting an alert indicative of the respective source of anomaly associated with the given one of the plurality of lists of event via the communication unit.

In one embodiment, each one of the events comprises one of a given state of operation and a given variation of state of operation.

In one embodiment, the given state of operation is an abnormal state of operation.

In one embodiment, the processing unit is further configured for determining the actual state of operation.

In one embodiment, the processing unit is adapted to transmit via the communication unit a request indicative of a desired state of operation for at least a desired one of the plurality of components.

In one embodiment, the processing unit is configured for determining that a given one of the plurality of lists of event has partially occurred using the actual state of operation by determining that a given number of events contained in the given one of the plurality of lists of event has occurred using the actual state of operation.

In one embodiment, at least one of the lists of events is predefined.

In one embodiment, the database further comprises a respective anomaly for each one of the plurality of lists of events and the alert further comprises the respective anomaly that is associated with the given one of the plurality of lists of events.

In one embodiment, a given one of the events contained in at least one of the plurality of lists of events is identified as being a required event.

In one embodiment, the database further contains a respective probability of occurrence associated with each one of the plurality of lists of events.

According to a further broad aspect, there is provided a computer-implemented method for preventing a problem in a simulator comprising a plurality of components, comprising: receiving an actual state of operation for at least some of the plurality of components; accessing a database containing a plurality of lists of events each associated with a respective source of anomaly; determining that a given one of the plurality of lists of event has partially occurred using the actual state of operation; and outputting an alert indicative of the respective source of anomaly associated with the given one of the plurality of lists of event.

In one embodiment, each one of the events comprises one of a given state of operation and a given variation of state of operation.

In one embodiment, the given state of operation is an abnormal state of operation.

In one embodiment, the step of receiving an actual state of operation comprises determining the actual state of operation.

In one embodiment, the step of determining the actual state of operation comprises transmitting a request indicative of a desired state of operation for at least a desired one of the plurality of components.

In one embodiment, the step of determining that a given one of the plurality of lists of event has partially occurred using the actual state of operation comprises determining that a given number of events contained in the given one of the plurality of lists of event has occurred using the actual state of operation.

In one embodiment, at least one of the lists of events is predefined.

In one embodiment, the database further comprises a respective anomaly for each one of the plurality of lists of events and the alert further comprises the respective anomaly that is associated with the given one of the plurality of lists of events.

In one embodiment, a given one of the events contained in at least one of the plurality of lists of events is identified as being a required event.

In one embodiment, the database further contains a respective probability of occurrence associated with each one of the plurality of lists of events.

According to still another embodiment, there is provided a computer-implemented method for diagnosing a problem in a simulator including a plurality of components, comprising: detecting an anomaly of a given one of the plurality of components; receiving an actual operation state for at least some of the plurality of components; among the at least some of the plurality of components, identifying particular components having a normal operation; and outputting an identification of the particular components having a normal operation.

According to still a further embodiment, there is provided a method for diagnosing a problem in a simulator including a plurality of components, comprising: detecting an anomaly of a given one of the plurality of components; receiving an actual operation state for at least some of the plurality of components; retrieving a reference operation state for each one of the at least some of the plurality of components; identifying a source of the failure using the reference state of operation; and outputting the source of the failure.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 1:
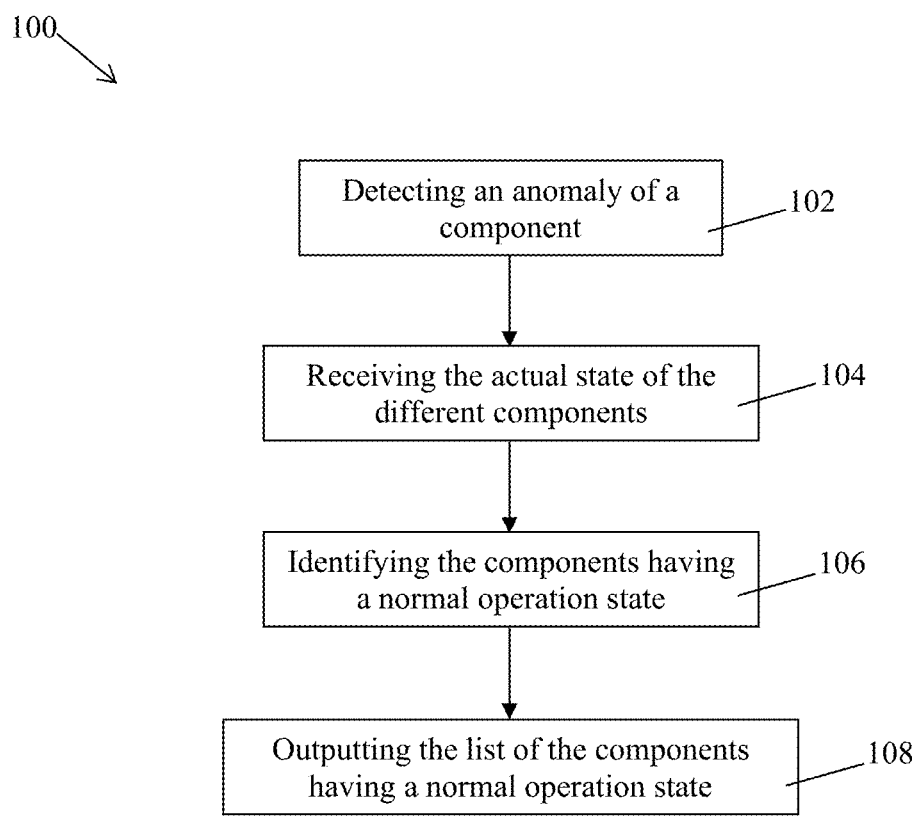
FIG. 1 is a flow chart illustrating a diagnosis method for a simulator, in accordance with a first embodiment.

A simulator is a complex system generally comprising a plurality subsystems, each comprising a plurality of components. A first type of component consists of non-computing hardware components such as such as sensors, mechanical actuators, pneumatic actuators, hydraulic actuators, displays, switches, lights, electric components, etc. A second type of components includes computing components. Computing components comprise hardware components such as processor for executing software, and software components. The software components may usually be divided into two types: middleware components and simulation model components. A computing component generally receives data, processes the received data by means of the specific software to generate new data, and transmits the new data. A computing component may also be capable of interacting with one or several dedicated hardware components. A computing component may receive data from a dedicated hardware component and/or send commands to the dedicated hardware component (e.g. receive data from a sensor and send actuating commands to an actuator). The computing components also exchange data with each other, to execute and synchronize the simulation.

A simulator is generally implemented as a plurality of sub-systems for implementing a plurality of functionalities of the simulator. Each sub-system comprises a plurality of computing components and a plurality of dedicated hardware components. The computing components are centrally controlled by one or several dedicated entities having at least one processor executing control software. The computing components may be implemented with dedicated cards; each dedicated card having specific electronic components designed to implement a specific functionality or sub-functionality of the simulator. Additionally, each dedicated card may only be capable of executing dedicated software stored in a memory of the dedicated card.

In one embodiment, a simulator consists of a plurality of systems and sub-systems. For example, the software sub-systems may comprise system simulation models, e.g. physical vehicle models or medical or physiological models, operating within a simulated synthetic environment. The synthetics environment in the case of a flight simulator consists of a virtual world simulating the earth terrain, the atmosphere physics such as air density, storm cell, clouds, fog, etc., and other entities such as aircraft, human, ground vehicles, etc. The simulation models are hosted by a simulation infrastructure consisting of distributed software and hardware components. The Aircraft/Patient simulation is extended to the real world by a plurality of heterogeneous hardware such as but not limited to an instructor support system, a visual and display system, a motion and control loading system, and/or the like, and multiple aircraft panels forming a complex mesh communication network. Due to the nature of a simulator, external support components are required to support the core infrastructure such as but not limited to a Heating, Ventilation and Air-Conditioning (HVAC) system, a fire detection system, a power distribution system, etc.

Due to its internal complexity and multiple interactions between hardware and software components within a same subsystem or between different subsystems, a simulator may have a non-linear behavior or a chaotic behavior, thereby rendering time-consuming the determination of the source of an anomaly for a person such as a technician or an engineer.

In the following, there are described computer-implemented methods and systems for diagnosing a simulator, i.e. determining the source of an anomaly occurring in the behavior of the simulator or at least helping a user to determine the source of the anomaly.

An anomaly refers to an abnormal behavior of a hardware or software component of the simulator or the failure of a hardware or software component.

In one embodiment, the diagnosis method consists in, after that an anomaly occurred in the simulator, analyzing the operation state of the different components of the simulator to identify the components that have a normal operation state. The list of normal operation components is then outputted so as to be analysed by an adequate person such as a user of the simulator, a technician, an engineer, or the like. Knowing which components operate normally, the person may focus his attention and analyze components of the simulator that were not identified as having a normal operation in order to find the source of the anomaly.

In another embodiment, the diagnosis method consists in comparing a state of operation of the simulator at the time an anomaly is detected or after the anomaly occurred to a reference state of operation. The comparison between the actual state of operation at the time of the anomaly and the reference state of operation allows determining which component of the simulator has an abnormal state of operation, and optionally the source of the detected anomaly. The source of anomaly, if identified, or the list of components having an abnormal state of operation is then outputted.

In a further embodiment, the diagnosis method relies on a database that contains lists of events and each list of events is associated with a respective anomaly and a respective source of anomaly. Upon detection of a given anomaly of the simulator, the state of operation of the components of the system is determined and the list(s) of events associated with the given anomaly is(are) retrieved from the database. The state of operation of the components is used to determine if the events contained in a given one of the retrieved lists of events occurred. If so, the source of anomaly associated with the given list of events is identified as being the source of the detected anomaly.

There is also provided a computer-implemented method and a system for preventing an anomaly in a simulator. In this case, the method also uses a database that contains lists of events and each list of events is associated with a respective anomaly and a respective source of anomaly. The components of the simulator are monitored and the state of operation of the components is used to determine if a predefined number of events contained in a given list of events occurred. If so, an alert is outputted. In one embodiment, the alert is indicative of the source of anomaly associated with the given list of events and optionally the corresponding anomaly associated with the given list of events.

FIG. 1 illustrates one embodiment of a computer-implemented method 100 for diagnosis of a simulator. As described above, the simulator may be an aircraft simulator, a vehicle simulator, an underground system simulator, a maritime simulator, a mining facility simulator, a nuclear plant simulator, a medical simulator, a patient simulator, etc.

At step 102, an anomaly of a component of the simulator is detected. In one embodiment, the step of detecting the anomaly comprises a diagnosis apparatus receiving a signal indicative of the anomaly. In this case, after noticing an anomaly, a user may send a message indicative of the anomaly to the diagnosis apparatus. In one embodiment, the message comprises an identification of a component that has the abnormal behavior or failed to operate. The message may further comprise an identification of the abnormal behavior of the component In another embodiment, the failure may be detected by the simulator itself. For example, a sensor present in the simulator may detect an abnormal operation of a component. For example, the simulator may determine that the temperature detected by a sensor is above a maximum threshold, and thereby determine an anomaly. In this case, a message indicative of the anomaly is transmitted to the diagnosis apparatus.

In a further embodiment, an anomaly may be detected by the diagnosis apparatus. For example, the state of operation of some components of the simulator may be transmitted periodically or substantially continuously by the simulator to the diagnosis apparatus. For each component, the diagnosis apparatus then determines if its operation is normal using the received state of operation or if an anomaly occurs. For example, if the temperature sent by a sensor is greater than a maximum threshold, the diagnosis apparatus determines an anomaly, i.e. an abnormally high temperature.

At step 104, the actual state of operation of at least some components of the simulator is received by the diagnosis apparatus.

In one embodiment, the actual operation state for each and every component present in the simulator is received at step 104. In another embodiment, the actual operation state of a least one component may not be received at step 104.

In one embodiment, a component of the simulator is adapted to determine its operation state and automatically transmit its operation state to the diagnosis apparatus. For example, a component may be adapted to periodically or substantially continuously determine and transmit its actual operation state. For example, when the component is a temperature sensor adapted to sense the temperature within a part of the simulator, the operation state corresponds to the sensed temperature and the temperature sensor may be adapted to periodically or substantially continuously sense and transmit the temperature to the diagnosis apparatus.

In another embodiment, a component may be adapted to transmit its actual state of operation upon request. In this case and upon detection of a failure, the diagnosis apparatus is adapted to transmit a request to a component. Upon reception of the request, the component determines its operation state and transmits the operation state to the diagnosis apparatus.

It should be understood that an operation state may be expressed in different ways. For example, an operation state may correspond to a value of a physical quantity. In this case, the operation state value may have a continuous value which may be comprised within a range, or may correspond to one of a predefined number of discrete values. For example, an operation state may correspond to a temperature value, a pressure value, a position of an actuator, a central processor unit (CPU) usage value, the value of an available space on a storing unit, etc. In another embodiment, an operation state may correspond to a binary value such as 0 or 1, on or off, open or closed, etc. In an embodiment in which the component is a software component, the operation state may correspond to the identification of a given piece of software installed on a machine, the identification of the last software update for a piece of software installed on a machine, etc.

It should be understood that more than one operation state may be associated with a component.

At step 106, the diagnosis apparatus identifies the components having a normal operation using the received actual operation states. For each component for which the actual operation state has been received, the actual operation state is compared to its corresponding normal state of operation stored in a database. If the actual operation mode of a given component corresponds to its predefined normal operation state, then the diagnosis apparatus identifies the given component as operating normally. It should be understood that the normal state of operation of a component may correspond to a single value, a plurality of discrete values, a range of values, etc.

In one embodiment, the normal state of operation value associated with a component may is predefined. In this case, the normal state of operation value may be inputted into the database prior to the use of the simulator. In another embodiment, the normal state of operation value is determined during use of the simulator when no failure is detected.

In an embodiment in which the operation state corresponds to a value of a physical quantity, the received value is compared to at least one predefined threshold and the normal operation state is determined as a function of the comparison. For example, the normal operation state of a temperature sensor may correspond to sensed temperatures that are less than a maximum threshold. If the temperature value received from the temperature sensor is less than the maximum threshold, then the temperature sensor is considered as normally operating. If the temperature value received from the temperature sensor is equal to or greater than the maximum threshold, then an abnormal operation is identified. It should be understood that a normal operation for a component may be defined by range of values, i.e. by a minimal threshold and a maximum threshold. In this case, the received operation state value may be considered as normal if it is comprised between the minimum and maximum thresholds.

In one embodiment, the determination of the normal/abnormal operation of the component takes into account the state of operation of another component. For example, if the CPU usage value of a processor is 50% while the simulator is in operation, the diagnosis apparatus may determine that the processor operates normally. However, if the same CPU usage value is received while the simulator is in maintenance, then the diagnosis apparatus may determine that the processor does not operate normally.

In an embodiment in which the operation state of a given component is defined by a binary value, then only two values are possible and a first one of the two possible values corresponds to normal operation while the second possible value corresponds to an abnormal operation. If the received operation state value corresponds to the first possible value, the component is considered as operating normally. Otherwise, the component is considered as operating abnormally.

At step 108, an identification of all the components that have been identified as normally operating at step 106 is outputted. The list of normally operating components may be stored in memory and/or sent to the simulator or a server.

In one embodiment, the list of the components identified as normally operating is displayed on a display unit to a user of the simulator, a technician, an engineer, or the like. Knowing which components operate normally, the user may then focus his attention on components which are not listed in the displayed list of components to determine the source of the failure since the source of the failure should correspond to a component of the simulator which does not operate normally.

As described above, it should be understood that an operation state may be expressed in different ways. It should be understood that in some cases it may not be possible to determine or know the actual operation state of at least one component. In this case, such components are ignored. Similarly, while it may be possible to receive the actual operation state of a given component, it may not be possible to determine whether the actual operation state corresponds to normal or abnormal operation for the given component. In this case, the operation state of the given component may be categorized as being unknown. Alternatively, the operation state of the given component may be categorized as abnormal.

Figure 2:
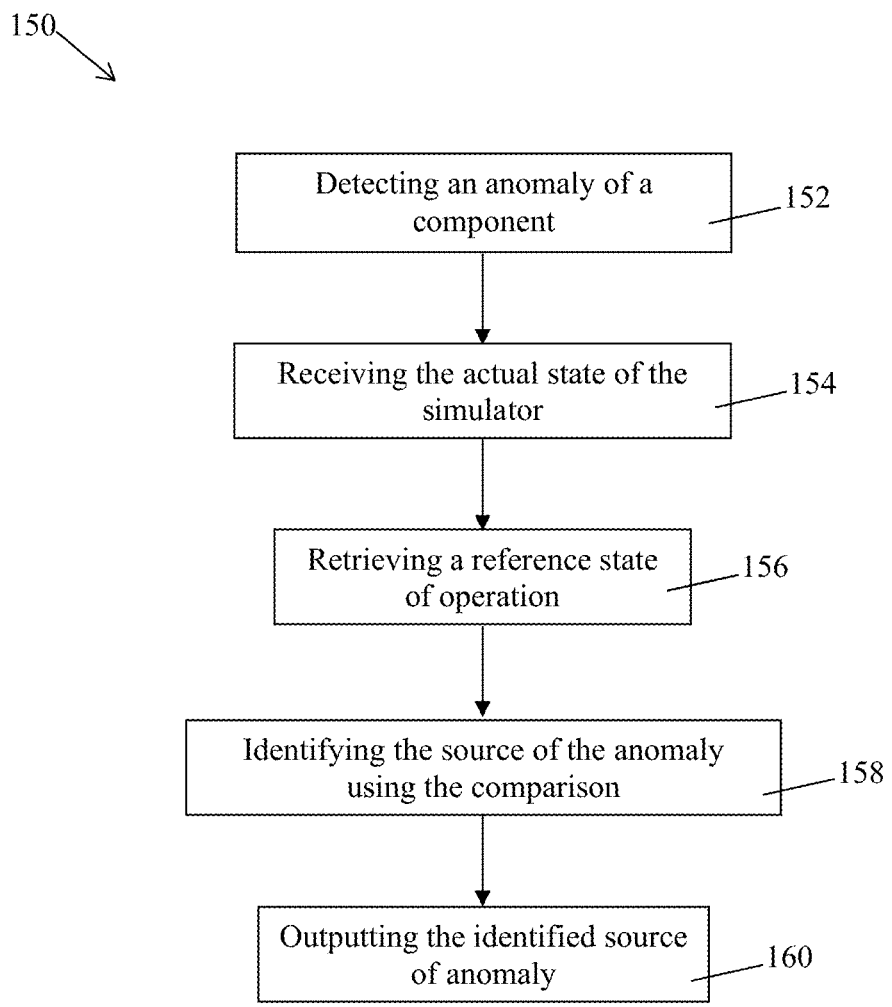
FIG. 2 is a flow chart illustrating a diagnosis method for a simulator, in accordance with a second embodiment.

FIG. 2 illustrates one embodiment of a second method 150 for diagnosis of a simulator. Similarly to the method 100, the simulator comprises a plurality of sub-systems which each contain hardware and/or software components.

At step 152, an anomaly of a component of the simulator is detected and transmitted to a diagnosis apparatus. As described above, the anomaly may be received from a person or the simulator itself. Alternatively, the diagnosis apparatus may detect the anomaly.

At step 154, the actual state of operation of the simulator or the state of operation of the simulator at the time of the anomaly is received by the diagnosis apparatus. In one embodiment, the state of operation of the simulator includes the state of operation of at least some components of the simulator.

In one embodiment, the actual operation state for each and every component present in the simulator is received at step 154. In another embodiment, the actual operation state of a least one component may not be received at step 154.

In one embodiment, a component of the simulator is adapted to determine its operation state and automatically transmit its operation state to the diagnosis apparatus. For example, a component may be adapted to periodically or substantially continuously determine and transmit its actual operation state. For example, when the component is a temperature sensor adapted to sense the temperature within a part of the simulator, the temperature sensor may be adapted to periodically or substantially continuously sense and transmit the temperature to the diagnosis apparatus.

In another embodiment, a component may be adapted to transmit its actual state of operation upon request. In this case and upon detection of an anomaly, the diagnosis apparatus is adapted to transmit a request to a component. Upon reception of the request, the component determines its operation state and transmits the operation state to the diagnosis apparatus.

At step 156, the diagnosis apparatus retrieves a reference state of operation for the simulator from a database.

In one embodiment, the reference state of operation corresponds to a normal state of operation for the simulator, i.e. the operation state of the components when the simulator is in normal operation and no anomaly is detected. To do so, the diagnosis apparatus accesses a database in which at least one normal state of operation of the simulator is stored. The normal state of operation of the simulator comprises a normal state of operation value for at least each component for which the actual state is received at step 154. It should be understood that a normal state of operation for a component may also be defined as a discrete value, a set of discrete values, a range of values, etc. In an embodiment in which the diagnosis apparatus receives the actual state of operation for each component contained in the simulator, the normal state of operation of the simulator stored in the database comprises a normal operation state value for each component present in the simulator. In an embodiment in which the diagnosis apparatus receives an actual operation state for only some of the components of the simulator, the normal state of operation of the simulator stored in the database comprises a normal state of operation value for at least the components for which the actual operation state has been received at step 154 and may also comprise a normal state of operation value for other components and even for all of the components present in the simulator.

In one embodiment, the normal state of operation value associated with a component is predefined. In this case, the normal state of operation value may be inputted into the database prior to the use of the simulator. In another embodiment, the normal state of operation value is determined during use of the simulator when no anomaly is detected.

In one embodiment, the normal state of operation value for at least some components is a constant in time value, or a constant in time range of values. In this case, the normal state of operation value does not change in time. For example, when the state of operation of a component can only be either "on" or "off", the normal state of operation for the component may be "on" which is a predefined and constant in time value. In this case, the normal state of operation value may be predefined. Alternatively, the normal state of operation value for a component may be determined during the normal operation of the simulator.

When the normal state of operation value for all of the components is constant in time, the normal state of operation of the simulator is also constant in time and may be defined only once prior to the use of the diagnosis apparatus. In another embodiment, the normal state of operation of the simulator may be determined during the normal operation of the simulator while in use. In a further embodiment, the normal state of operation value for some of the components may be defined prior to the use of the simulator while the normal state of operation value for other components may be determined during the normal operation of the simulator while in use.

In another embodiment, the normal state of operation for at least some components may vary in time. In this case, the normal state of operation of the simulator varies in time and may be determined at different points in time during the normal operation of the simulator. This is done by determining the normal state of operation of given components for which the normal state of operation value may change in time at different points in time. For example, the diagnosis apparatus may periodically receive the operation state value from the given components or periodically request the operation state from the given components.

In another embodiment, the given reference state of operation retrieved at step 156 corresponds to an abnormal state of operation. In this case, the diagnosis apparatus accesses a database which comprises a plurality of abnormal states of operation for the simulator and a respective source of anomaly for each abnormal state of operation. Each abnormal state of operation of the simulator is defined by a state of operation value for at least some of the components of the simulator. In one embodiment, an abnormal state of operation of the simulator may be predefined and its corresponding source of anomaly may be predefined. In another embodiment, an abnormal state of operation may be determined following a previous anomaly of the same simulator or another simulator. Each time an anomaly is detected for the simulator or another simulator and the source of anomaly is determined, the state of operation of the simulator at the time of the anomaly, i.e. the abnormal state of operation, is stored in the database along with its corresponding source of anomaly.

In this case, the diagnosis apparatus retrieves the reference state of operation for the simulator by comparing the actual state of operation of the simulator to the abnormal states of operation stored in the database. The reference abnormal state of operation is identified as being the abnormal state of operation that matches the actual state of operation.

Referring back to FIG. 2 and once the reference state of operation of the simulator has been retrieved, the diagnosis apparatus identifies the source of the anomaly using the reference state of operation for the simulator at step 158.

In an embodiment in which the reference state of operation is a normal state of operation, the diagnosis apparatus may compare the actual state of operation of the simulator to the normal state of operation. The diagnosis apparatus compares, for each component for which an actual operation state value has been received, the actual operation state value to its corresponding normal state operation value contained in the retrieved normal state of operation of the simulator. The component for which the actual operation state value does not correspond to its respective normal operation state value is identified as having an abnormal operation and is identified as being the source of the anomaly.

In another embodiment in which the reference state of operation is a normal state of operation, the diagnosis apparatus may determine if a change of a component of the simulator has occurred between the time at which the normal state of operation has been recorded and the time at which the anomaly occurred. In this case, each time a component is changed, the change of component is recorded in the database. A change of a component may correspond to the replacement of a component, the addition of a new component, the removal of a component, the repair of a component, the installation of a software component, the update of a software component, etc.

In one embodiment, the diagnosis apparatus is adapted to receive an indication of the change of a component from a user or the simulator. In this case, the diagnosis apparatus stores the change of component and the time at which the change of component was received in the database each time a change of component is received.

In another embodiment, the diagnosis apparatus is adapted to determine a change of component using the received state of operation of the components of the simulator. In this case, the diagnosis apparatus stores the change of component and the time at which the change of component was detected in the database each time the diagnosis apparatus determines a change of component.

If the diagnosis apparatus determines that a change of component between the time at which the normal state of operation has been stored in the database and the time at which the anomaly is detected, the diagnosis apparatus determines that the source of anomaly is the component for which a change has been detected.

In an embodiment in which the reference state of operation is a given one of abnormal states of operation stored in the database, the diagnosis apparatus identifies the source of the anomaly detected at step 152 as being the source of anomaly associated with the given abnormal state of operation retrieved at step 156.

At step 160, the identified source of anomaly is outputted.

In one embodiment, the identified source of anomaly is stored in a memory which may be contained within the diagnosis apparatus or externally on a database or a server. In the same or another embodiment, the identified source of anomaly is transmitted to the simulator to be stored thereon and optionally displayed on a local display unit.

Figure 3:
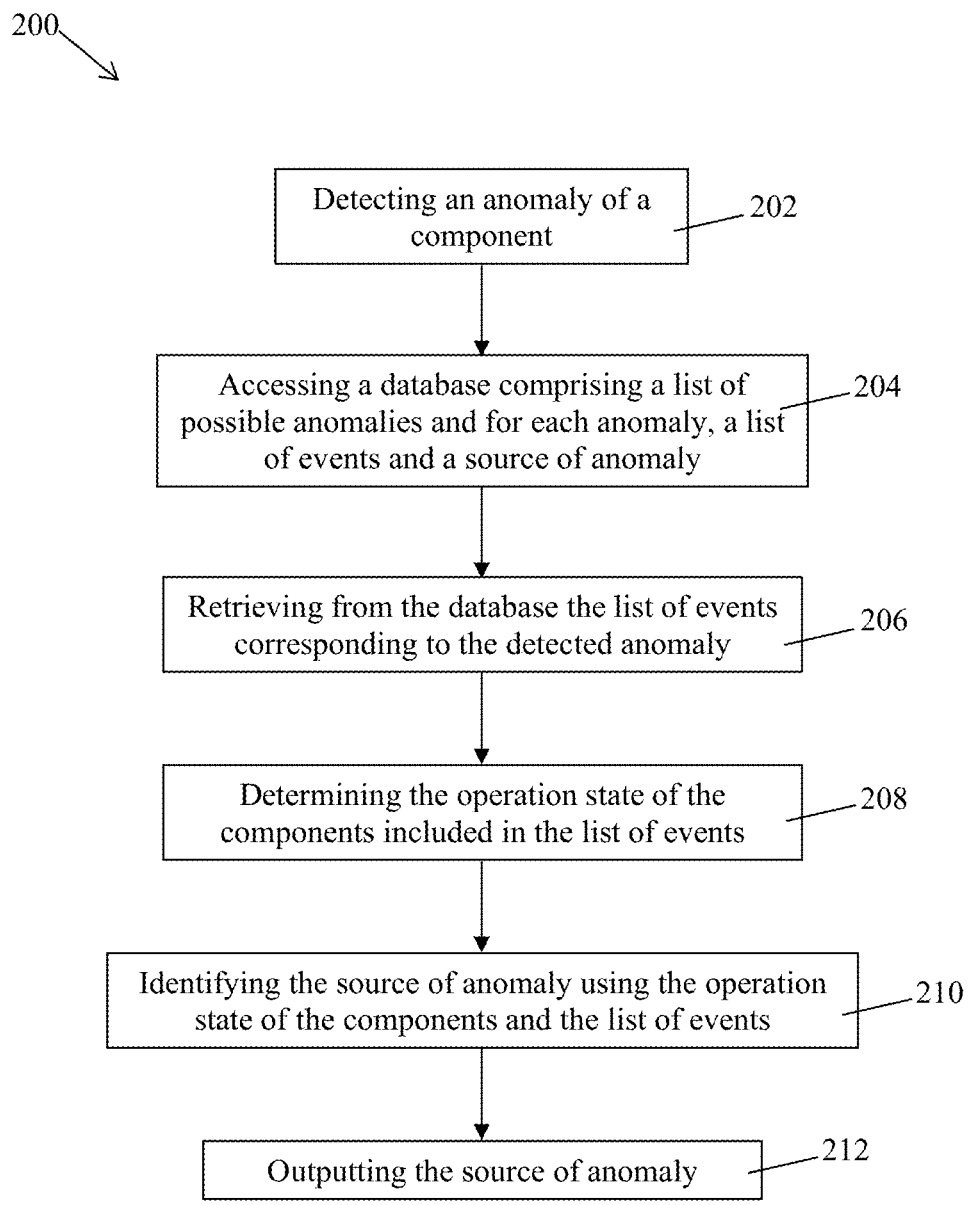
FIG. 3 is a flow chart illustrating a diagnosis method for a simulator, in accordance with a third embodiment.

FIG. 3 illustrates one embodiment of a method 200 for diagnosing of a simulator. Similarly to the methods 100 and 150, the simulator comprises a plurality of sub-systems which each contain hardware and/or software components.

At step 202, the failure of a component of the simulator is detected. As described above, the anomaly may be received from a person or the simulator itself. Alternatively, the diagnosis apparatus may detect the anomaly.

At step 204, the diagnosis apparatus accesses a database of possible sources of anomalies. The database comprises a list of anomalies for components. An anomaly may be defined as a particular problem for a given component. For each possible anomaly, the database further comprises a respective list or sequence of events and a respective source of anomaly. An event may be a particular state of operation for a given component such as an abnormal operation of a component, a change or variation of state of operation for a component such as a predefined increase of temperature over a predefined period of time, etc. In one embodiment, a same anomaly may be associated with more than one list of events and more than one source of failure. For example, when the abnormal operation of at least two different components may lead to the same anomaly, then the same anomaly may be caused by different sources. In this case, the database comprises at least two different lists or sequences of events each associated with a respective source of anomaly for the same anomaly.

In one embodiment, a list or sequence of events and its associated source of anomaly are predefined for a given anomaly of a component. In this case, the anomaly and its respective list of events and source of anomaly are stored in the database prior to the use of the diagnosis apparatus.

In another embodiment, the list of events and its associated source of anomaly for a given anomaly of a component are determined during the use of the simulator. For example, when an anomaly of a given component occurs, the diagnosis apparatus may interrogate the simulator to determine the state of operation of the different components at the time of the anomaly and/or previous to the anomaly. Once the source of anomaly has been determined by a technician for example and transmitted to the diagnosis apparatus, the diagnosis apparatus generates a list of events using the determined state of operation for the different components and associates the generated list of events to the detected anomaly and the source of anomaly.

For example, the list of events may comprise the identification of the components which have an abnormal operation, and optionally the type of its detected abnormal operation and/or the abnormal operation state, at the time of the anomaly and/or during a predetermined period of time prior to the anomaly. In one embodiment, the events present in the list are timely ordered according to the time at which each event occurred and the list of events corresponds to a sequence of events.

At step 206, the list of events that corresponds to the detected anomaly is retrieved from the database. As described above, the list of events comprises at least one event which is defined by a component and a state of operation value or a variation or change of operation state value over a given period of time for the component. The following present an exemplary sequence of events associated with an anomaly of a display unit, i.e. stepping of the display unit: increase of computer temperature→decrease of the CPU speed→CPU-bound→CPU overrun. The source of anomaly associated with the present exemplary sequence of events is a dirty air filter.

At step 208, the operation state value of the components for which an event is included in the list of events retrieved at step 206 is determined. In one embodiment, the operation state value corresponds to the operation state value at the time of the anomaly, just before the anomaly occurs or after the anomaly occurred. In another embodiment, the operation state value corresponds to a variation of the operation state value during a predefined period of time before the failure occurs.

Referring back to the example, the diagnosis apparatus determines the variation of the operation state of a temperature sensor included into the computer for which the display unit stepped and the variation of the operation state of the CPU of the computer. The operation state value of the temperature sensor is the temperature sensed by the temperature sensor and the operation state value of the CPU comprises two values, i.e. the CPU speed and the CPU usage. In this case, the diagnosis apparatus determines the variation of the sensed temperature, the variation of the speed of the CPU and the variation of the CPU usage, prior to the failure.

At step 210, the diagnosis apparatus identifies the source of anomaly by analyzing the operation state of the different components to determine if a given list of events retrieved at step 206 occurred. When the operation state of a component is represented by an operation state value, the diagnosis apparatus determines whether the operation state value of the component corresponds to an event included in one of the lists of events retrieved at step 206. If the operation state matches a given event of a given list of events, the diagnosis apparatus determines that the given event occurred. When the operation state of a component is represented by a variation of an operation state value, the diagnosis apparatus determines whether the variation of operation state value of the component corresponds to an event included in one of the lists of events retrieved at step 206. If the variation of operation state matches a given event of a given list of events, the diagnosis apparatus determines that the given event occurred.

If the diagnosis apparatus determines that all of the events of a given list of events retrieved at step 206, the diagnosis apparatus identifies the source of anomaly associated with the given list of events as being the source of the anomaly detected at step 202.

Referring back to the example, if the diagnosis apparatus determines that, before the anomaly, the sensed temperature increased before the failure, the CPU speed decreases before the failure and a CPU-bound and a CPU overrun occurred using the CPU usage, then the diagnosis apparatus concludes that each event included in the list of events associated with a dirty air filter occurred. In this case, the diagnosis apparatus determines that the source of the stepping display unit is a dirty air filter. If the diagnosis apparatus determines that at least one event contained in the list did not occur, e.g. that no CPU-bound and no CPU overrun occurred, then the diagnosis apparatus determines that the air filter is not the source of the failure. In this case, the diagnosis apparatus may retrieve another lists of events associated with the display unit stepping failure and determines whether all of the steps contained within this second list have occurred.

At step 212, the identified source of anomaly is outputted. For example, the identified source of anomaly may be stored locally or externally in a memory. In the same or another example, the identified source of anomaly may be sent to the simulator to be displayed thereon.

In an embodiment in which the database comprises more than two lists of events for a same anomaly, a probability of occurrence may be associated with each list of events. The probability of occurrence for a given list of events provides the probability that the source of anomaly associated with the given list of events occurs. In this case, the diagnosis apparatus first considers the list of events having the greatest probability to determine whether the source of the detected failure corresponds to the source of failure associated with the list of events having the greatest probability. If not, the diagnosis apparatus considers the list of events having the second greatest probability, etc.

In one embodiment, the probability of occurrence is predefined and has a constant value. In another embodiment, the probability of occurrence may vary in time. For example, a diagnosis apparatus may be in communication with multiple simulators and use the data received from the simulators to determine the probability of occurrence associated with the lists of events. The probability of occurrence for different list of events all associated with a same failure may be related to the number of times that the source of anomaly associated with the lists of events was determined as being the real source of anomaly. In this case, the diagnosis apparatus is adapted to calculate the new probability of occurrence for each list of events associated with the same anomaly each time the source of anomaly associated with a given list of events was determined as being the real source of anomaly.

Figure 4:
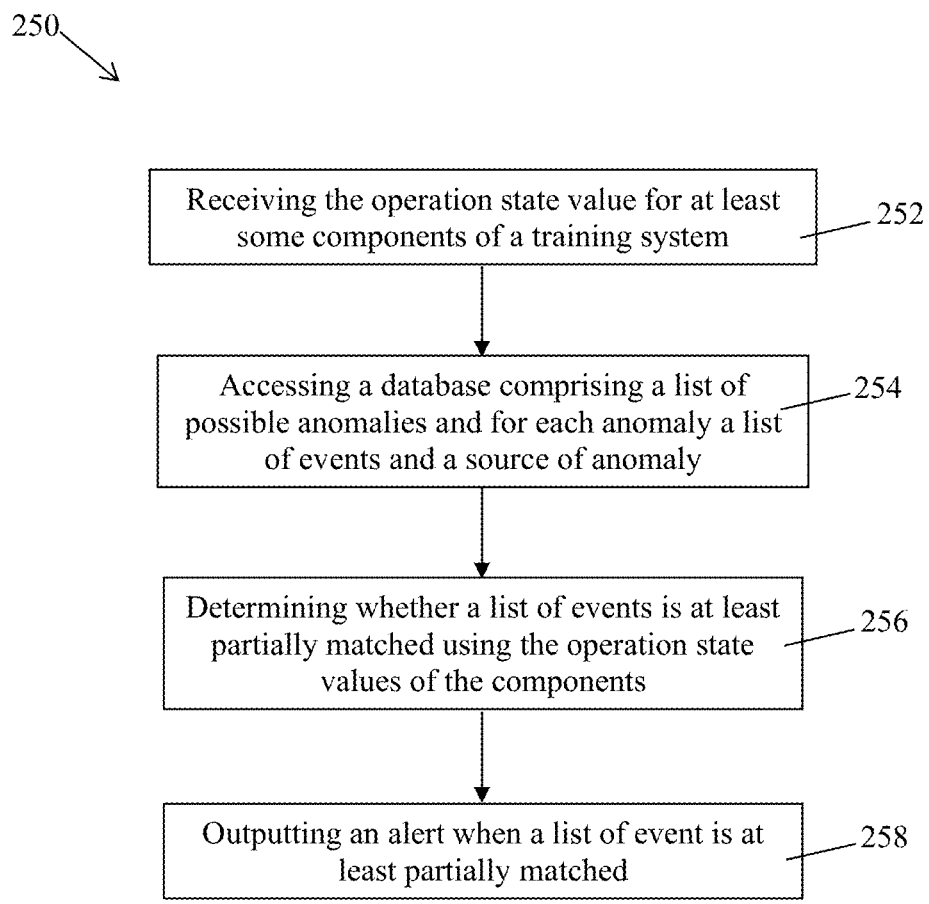
FIG. 4 is a flow chart illustrating a method for predicting failures in a simulator, in accordance with an embodiment.

In one embodiment the diagnosis apparatus may be adapted to prevent an anomaly before it occurs. FIG. 4 illustrates one embodiment of a method 250 for preventing anomalies of a simulator.

At step 252, a diagnosis apparatus receives the operation state value for at least some components of the simulator. In one embodiment, the operation state value for at least one component is received substantially continuously. In another embodiment, the operation state value for at least one component is received periodically.

In one embodiment, at least one component of the simulator is adapted to transmit its operation state value to the diagnosis apparatus automatically without any request from the diagnosis apparatus. In another embodiment, the diagnosis apparatus is adapted to transmit a request to at least one component of the simulator which transmits its operations state value to the diagnosis apparatus upon receipt of the request.

The diagnosis apparatus stores in memory the received operation state values of the components and accesses a database of lists of events at step 254. As described above, the database comprises a plurality of lists or sequences of events each being associated with a respective anomaly of a component and a respective source of anomaly.

At step 256, the diagnosis apparatus determines whether at least a portion of a given list of events stored in the database has occurred in the simulator using the received operation states of the components.

In one embodiment, a predefined percentage or a predefined minimal number of events is associated with each list of events in the database. The predefined percentage or minimal number corresponds to a threshold above which an alert is to be triggered.

In the same or another embodiment, an identification of at least one required event contained in the list is also associated with a list of events. In this case, an alert can only be generated if the diagnosis apparatus determines that the required event(s) occurred.

In one embodiment and as described above, an occurrence probability is associated with each list of events.

At step 256, the diagnosis apparatus determines whether at least a portion of a list of events has occurred using the received operation state values for the components. If the diagnosis apparatus determines that a minimal number of events contained in a given list of events occurred, the diagnosis apparatus concludes that the anomaly associated with the given list of event may occur and generates an alert. The minimal number of events that must have occurred to trigger the alert is retrieved from the memory. As described above, the minimum number of events may correspond to a percentage.

In an embodiment in which the database comprises occurrence probabilities associated with lists of events, the diagnosis apparatus tries to first determine whether the lists of events having the greatest probabilities have occurred.

At step 258, the alert generated by the diagnosis apparatus is outputted. In one embodiment, the alert is stored in memory. In the same or another embodiment, the alert is transmitted to the simulator to be displayed on a display unit thereon or to a server. In a further embodiment, a message containing the alert, such as an email or a text message, is transmitted to a technician in charge of the simulator.

In one embodiment, the alert comprises an identification of the failure and source of failure associated with the list of events for which it has been determined that the corresponding minimum number of events occurred.

Referring back to the example of the display unit stepping failure having the list of events (increase of computer temperature→decrease of the CPU speed→CPU-bound-→CPU overrun) associated thereto, the diagnosis apparatus receives the sensed temperature from the temperature sensor and the CPU speed and usage from the computer. For example, the minimum number of steps associated with this list of events may be equal to 2 (or 50% of the number of events contained in the list). In this case, if the diagnosis apparatus determines that at least two events of the list of events have occurred, the diagnosis apparatus generates an alert. The alert may be indicative of the possible failure, i.e. stepping of the display unit, and the source of failure, i.e. dirty air filter. In this case, the person receiving the alert may clean the air filter before any failure of the display unit occurs.

If the diagnosis apparatus determines that only one step has occurred, then no alert is generated.

In an example in which a required event, e.g. the temperature increase, is associated with the list of event, the alert can be generated only if the diagnosis apparatus determines that a temperature increase occurred. For example, if the diagnosis apparatus determines that the speed of the CPU decreased and that a CPU-bound occurred, no alert would be generated since the diagnosis apparatus has not determined that a temperature increase occurred even though the minimum number of events, i.e. two events, has been detected.

It should be understood that at least two of the above described methods may be combined together or concurrently performed in order to diagnose a simulator. For example, the method 200 may further comprise the steps 104-108 of the method 100.

In one embodiment, each of the above-described method may be embodied as a computer program product comprising a computer readable memory storing computer executable instructions thereon that when executed by a computer perform the step of the method.

Figure 5:
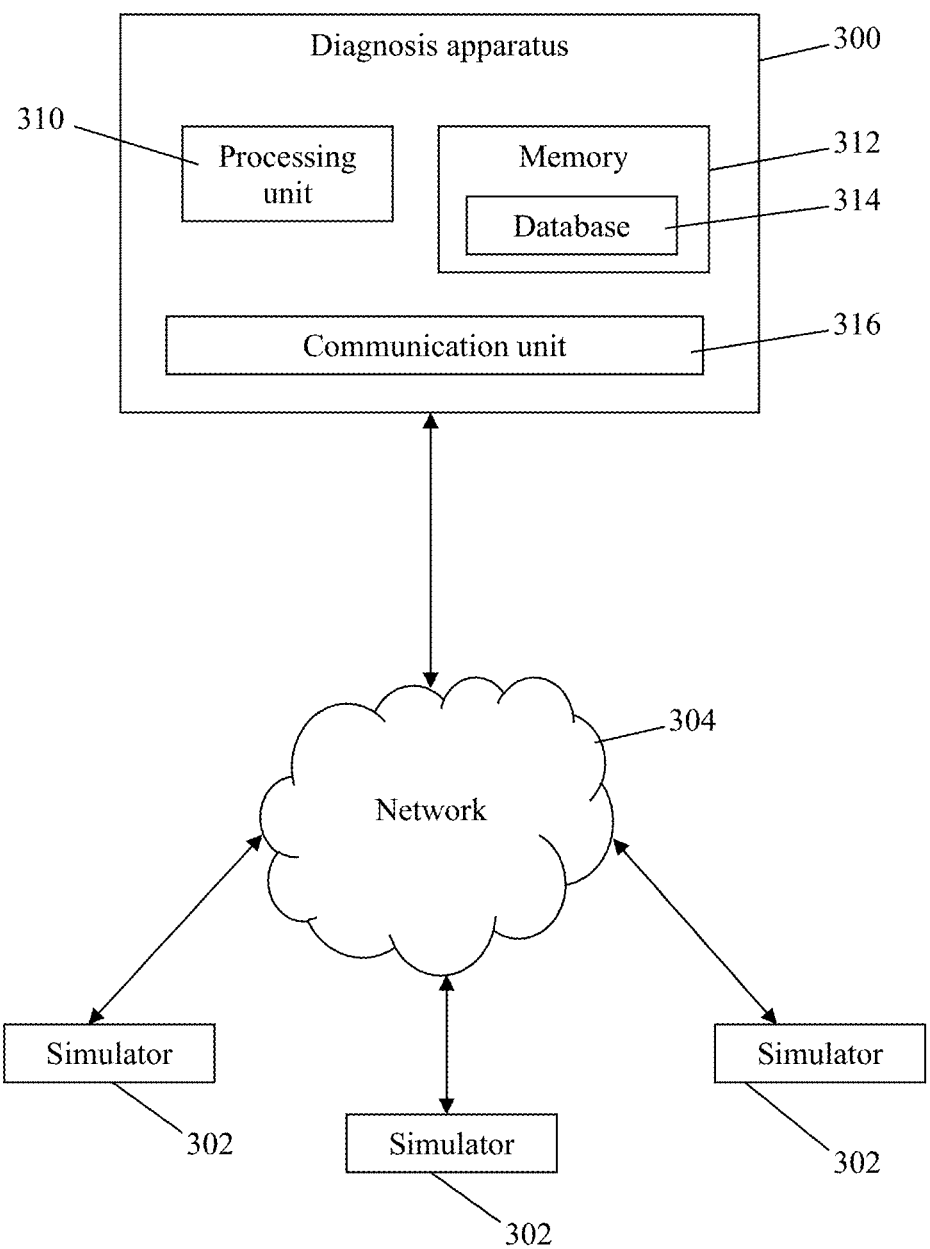
FIG. 5 illustrates one embodiment of a diagnosis or preventing apparatus for diagnosing a simulator or preventing an anomaly in a simulator, in accordance with an embodiment.
Figure 6:
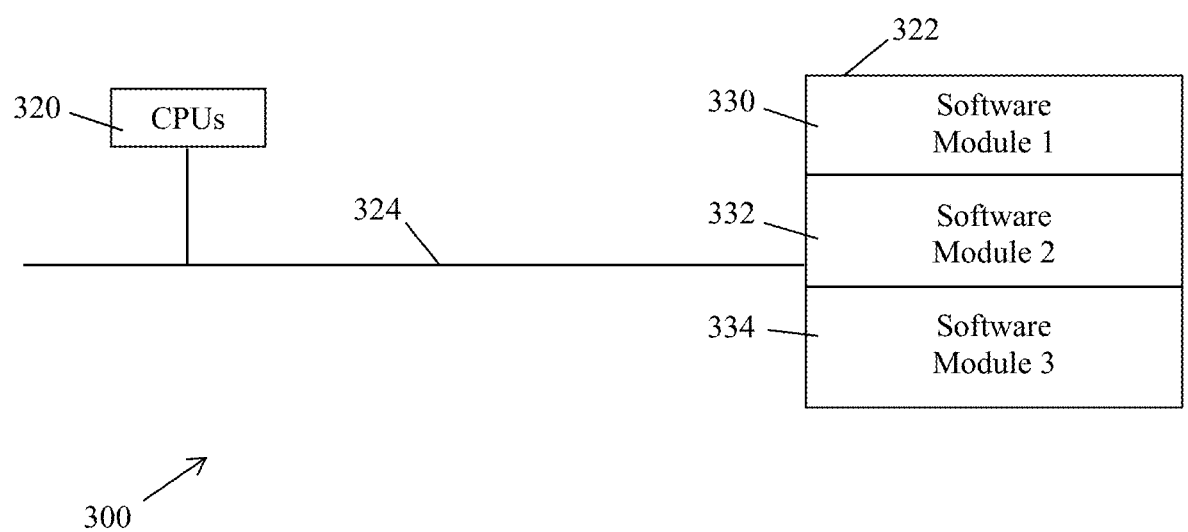
FIG. 6 illustrates an exemplary structure for the apparatus of FIG. 5.

Each of the above-described methods may also be embodied as an apparatus as illustrated in FIG. 5 which illustrates a diagnosis apparatus 300 adapted to diagnose anomalies occurring in at least one simulator 302. The diagnosis apparatus 300 and the simulator(s) 302 are in communication via a communication network 304.

The diagnosis apparatus 300 comprises a processing unit 310, a memory 312 having at least a database 314 stored thereon, and a communication unit 316 for transmitting and/or receiving data via the network 304.

In an embodiment in which the diagnosis apparatus 300 is adapted to execute the method 100, the processing unit 310 is configured to detect an anomaly of a simulator 302, receive the actual state of operations of at least some of the components of the simulator 302, identify the components that have a normal operation using normal operations states for the components stored in the database 314 and output the list of components having a normal operation, as described above with respect to FIG. 1.

In an embodiment in which the diagnosis apparatus 300 is adapted to execute the method 150, the processing unit 310 is configured for detecting an anomaly occurring in a simulator 302, receiving the actual state of operation of the simulator 302, retrieving a reference state of operation for the simulator 302 from the database 314, identifying the source of the anomaly, and outputting the identified source of anomaly, as described above with respect to FIG. 2.

In an embodiment in which the diagnosis apparatus 300 is adapted to execute the method 200, the processing unit 310 is configured for detecting an anomaly occurring in a simulator 302, accessing the database 314 containing a list of possible anomalies and for each anomaly, a list of events and a source of anomaly, retrieving from the database 314 the lists of events that correspond to the detected anomaly, determining the state of operation of at least some components of the simulator 302, identifying the source of the anomaly by comparing the determined state of operations for the components and the lists of events, and outputting the source of anomaly, as described above with respect to FIG. 3.

In an embodiment in which the diagnosis apparatus 300 is adapted to execute the method 250, the apparatus 300 corresponds to an apparatus for preventing an anomaly in a simulator 302 and the processing unit 310 is configured for receiving the operation state of at least some components of the simulator 302, accessing the database 314 containing a list of possible anomalies and for each anomaly, a list of events and a source of anomaly, determining that a given list of events has been partially occurred, and outputting an alert, as described above with respect to FIG. 4.

In one embodiment, the apparatus 300 may be embodied as a computing cloud comprising at least one storing unit and at least one processing unit. In this case, the steps of the methods 100, 150, 200 and/or 250 may be executed by different processing units and the information contained in the database may be stored on different storing units.

It should be understood that the apparatus 300 may be adapted to execute more than one method 100, 150, 200, 250.

FIG. 5 illustrates an exemplary internal structure for the apparatus 300. In this case, the apparatus 300 comprising is a processing module 320 for executing the steps of the methods 100, 150, 200 and/or 250, a memory 322 and at least one communication bus 324 for interconnecting these components. The processing module 320 typically includes one or more Computer Processing Units (CPUs) and/or Graphic Processing Units (GPUs) for executing modules or programs and/or instructions stored in memory and thereby performing processing operations. The communication buses 324 optionally include circuitry (sometimes called a chipset) that interconnects and controls communications between system components. The memory 322 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The memory 322 optionally includes one or more storage devices remotely located from the CPU(s). The memory 322, or alternately the non-volatile memory device(s) within the memory, comprises a non-transitory computer readable storage medium. In some embodiments, the memory, or the computer readable storage medium of the memory stores programs, software modules, and data structures 330, 332, 334, or a subset thereof.

For example, when the apparatus 300 is adapted to execute the method 200, the memory 322 may comprise a detection module for detecting an anomaly of the simulator 302, a database accessing module for accessing the database and retrieving lists of events therefrom, an operation state module for determining the state of operation of the components of the simulator 302, an identification module for identifying the source of the anomaly, and a communication module for outputting the source of the anomaly.

In another example, when the apparatus 300 is adapted to execute the method 250, the memory 322 may comprise an operation state module for determining the state of operation of the components of the simulator 302, a database accessing module for accessing the database containing lists of events, a determination module for determining when a list of events partially occurred, and a communication module for outputting an alert.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, the memory may store a subset of the modules and data structures identified above. Furthermore, the memory may store additional modules and data structures not described above.

The embodiments of the invention described above are intended to be exemplary only. The scope of the invention is therefore intended to be limited solely by the scope of the appended claims.

We claim:

1. An apparatus for preventing a problem in a simulator comprising a plurality of components, the apparatus comprising:
   a communication unit for at least one of transmitting data and receiving data;
   a memory having stored thereon a database containing a plurality of predetermined lists of events, each one of the predetermined lists of events being associated with a respective source of anomaly; wherein:
      the respective source of anomaly is one of the plurality of components; and
      a partial occurrence of any one of the predetermined lists of events forebodes a future anomaly attributable to the respective source of anomaly; and
   a processing unit configured for:
      receiving an actual state of operation for at least some of the plurality of components;
      determining that a given one of the plurality of predetermined lists of events has partially occurred by determining that a given minimal number of events contained in the given one of the plurality of predetermined lists of events have occurred using the actual state of operation, the given minimal number of events being at least equal to two;
      retrieving the respective source of anomaly associated with the given one of the plurality of predetermined lists of events; and
      outputting an alert indicative of the retrieved source of anomaly via the communication unit to inform a user of the simulator about a possible failure of the simulator before the possible failure of the simulator occurs.

2. The apparatus of claim 1, wherein each one of the events comprises one of a given state of operation and a given variation of state of operation.

3. The apparatus of claim 2, wherein the given state of operation is an abnormal state of operation.

4. The apparatus of claim 1, wherein the processing unit is further configured for determining the actual state of operation.

5. The apparatus of claim 4, wherein the processing unit is adapted to transmit via the communication unit a request indicative of a desired state of operation for at least a desired one of the plurality of components.

6. The apparatus of claim 1, wherein at least one of the predetermined lists of events is predefined.

7. The apparatus of claim 1, wherein the database further comprises a respective anomaly for each one of the plurality of predetermined lists of events and the alert further comprises the respective anomaly that is associated with the given one of the plurality of predetermined lists of events.

8. The apparatus of claim 1, wherein a given one of the events contained in at least one of the plurality of predetermined lists of events is identified as being a required event.

9. The apparatus of claim 1, wherein the database further contains a respective probability of occurrence associated with each one of the plurality of predetermined lists of events.

10. A computer-implemented method for preventing a problem in a simulator comprising a plurality of components, the method comprising:
   receiving an actual state of operation for at least some of the plurality of components;
   accessing a database containing a plurality of predetermined lists of events, each one of the predetermined lists of events being associated with a respective source of anomaly, the respective source of anomaly being one of the plurality of components, a partial occurrence of any one of the predetermined lists of events foreboding a future anomaly attributable to the respective source of anomaly;
   determining that a given one of the plurality of predetermined lists of events has partially occurred by determining that a given minimal number of events contained in the given one of the plurality of predetermined lists of events have occurred using the actual state of operation, the given minimal number of events being at least equal to two;
   retrieving the respective source of anomaly associated with the given one of the plurality of predetermined lists of events; and
   outputting an alert indicative of the retrieved source of anomaly to inform a user of the simulator about a possible failure before the possible failure of the simulator occurs.

11. The computer-implemented method of claim 10, wherein each one of the events comprises one of a given state of operation and a given variation of state of operation.

12. The computer-implemented method of claim 11, wherein the given state of operation is an abnormal state of operation.

13. The computer-implemented method of claim 10, wherein said receiving an actual state of operation comprises determining the actual state of operation.

14. The computer-implemented method of claim 13, wherein said determining the actual state of operation comprises transmitting a request indicative of a desired state of operation for at least a desired one of the plurality of components.

15. The computer-implemented method of claim 10, wherein at least one of the predetermined lists of events is predefined.

16. The computer-implemented method of claim 10, wherein the database further comprises a respective anomaly for each one of the plurality of predetermined lists of events and the alert further comprises the respective anomaly that is associated with the given one of the plurality of predetermined lists of events.

17. The computer-implemented method of claim 10, wherein a given one of the events contained in at least one of the plurality of predetermined lists of events is identified as being a required event.

18. A non-transitory computer program product comprising a computer readable memory storing computer executable instructions thereon that when executed by a computer perform method steps of:

receiving an actual state of operation for at least some of plurality of components;

accessing a database containing a plurality of predetermined lists of events, each one of the predetermined lists of events being associated with a respective source of anomaly, the respective source of anomaly being one of the plurality of components, a partial occurrence of any one of the predetermined lists of events foreboding a future anomaly attributable to the respective source of anomaly;

determining that a given one of the plurality of predetermined lists of events has partially occurred by determining that a given minimal number of events contained in the given one of the plurality of predetermined lists of events have occurred using the actual state of operation, the given minimal number of events being at least equal to two;

retrieving the respective source of anomaly associated with the given one of the plurality of predetermined lists of events; and outputting an alert indicative of the retrieved source of anomaly to inform a user of the simulator about a possible failure of the simulator before the possible failure of the simulator occurs.

\* \* \* \* \*